United States Patent [19]

Spyrou

[11] Patent Number: 5,608,645

[45] Date of Patent: Mar. 4, 1997

[54] METHOD OF FINDING A CRITICAL PATH IN A CIRCUIT BY CONSIDERING THE CLOCK SKEW

[75] Inventor: Athanasius W. Spyrou, San Jose, Calif.

[73] Assignee: VLSI Technology, Inc., San Jose, Calif.

[21] Appl. No.: 214,482

[22] Filed: Mar. 17, 1994

[51] Int. Cl.⁶ ................................................. G06G 7/122
[52] U.S. Cl. ............................................................ 364/491
[58] Field of Search .................................... 364/488, 489, 364/490, 491; 327/232; 324/158; 368/113

[56] References Cited

U.S. PATENT DOCUMENTS

| | | | |
|---|---|---|---|
| 4,908,772 | 3/1990 | Chi | 364/491 |
| 5,003,256 | 3/1991 | Merrill | 324/158 |
| 5,128,871 | 7/1992 | Schmitz | 364/490 |
| 5,204,559 | 4/1993 | Dehimy et al. | 327/232 |
| 5,224,056 | 6/1993 | Chene et al. | 364/490 |
| 5,235,566 | 8/1993 | Merrill | 368/113 |
| 5,237,514 | 8/1993 | Curtin | 364/490 |
| 5,367,469 | 11/1994 | Hartoog | 364/491 |
| 5,402,357 | 3/1995 | Schaefer et al. | 364/490 |

OTHER PUBLICATIONS

Timing Optimization of Combinational Logic, IEEE 1988.
Clock Layout for High-Performance ASIC Based on Weighted Center Algorithm, IEEE 1991.

*Primary Examiner*—Kevin J. Teska
*Assistant Examiner*—Dan Fiul
*Attorney, Agent, or Firm*—Burns, Doane, Swecker & Mathis, LLP

[57] ABSTRACT

The present invention is directed to a method of designing and fabricating a circuit layout which revolutionizes the manner by which critical weights of a circuit layout are assessed. In accordance with exemplary embodiments, a critical path is assessed on the basis of both a physical delay associated with a data propagation path and with respect to any clock skew which exists with respect to the data propagation path. A critical path can be a path having the shortest physical length from an input node to an output node if the clock skew along this path results in a high probability of a race condition. In accordance with exemplary embodiments, clock skew is assessed by determining the time differential between the arrival of a clock signal at a given data source instance and the arrival of a clock signal at a given data destination instance.

18 Claims, 3 Drawing Sheets

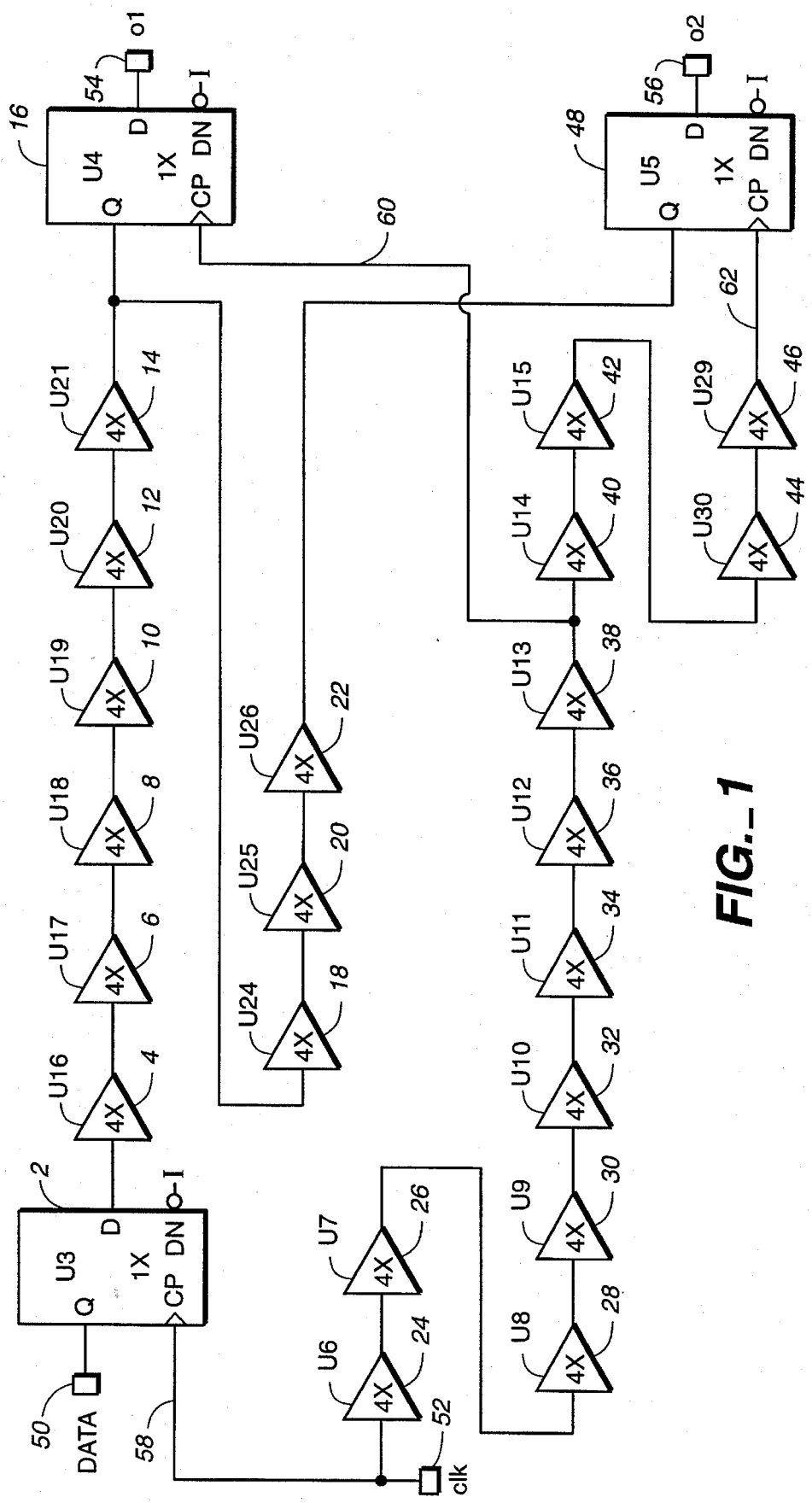
FIG._1

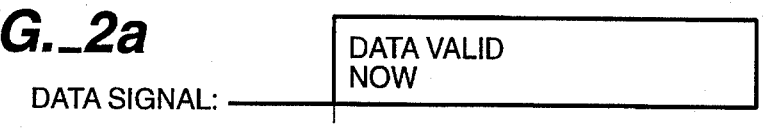
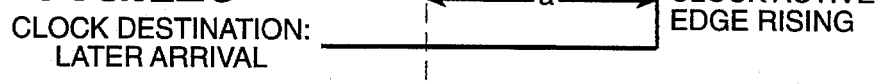
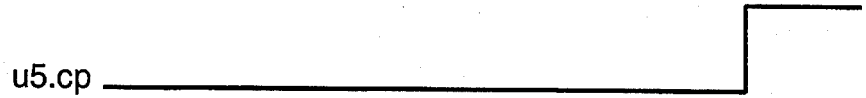

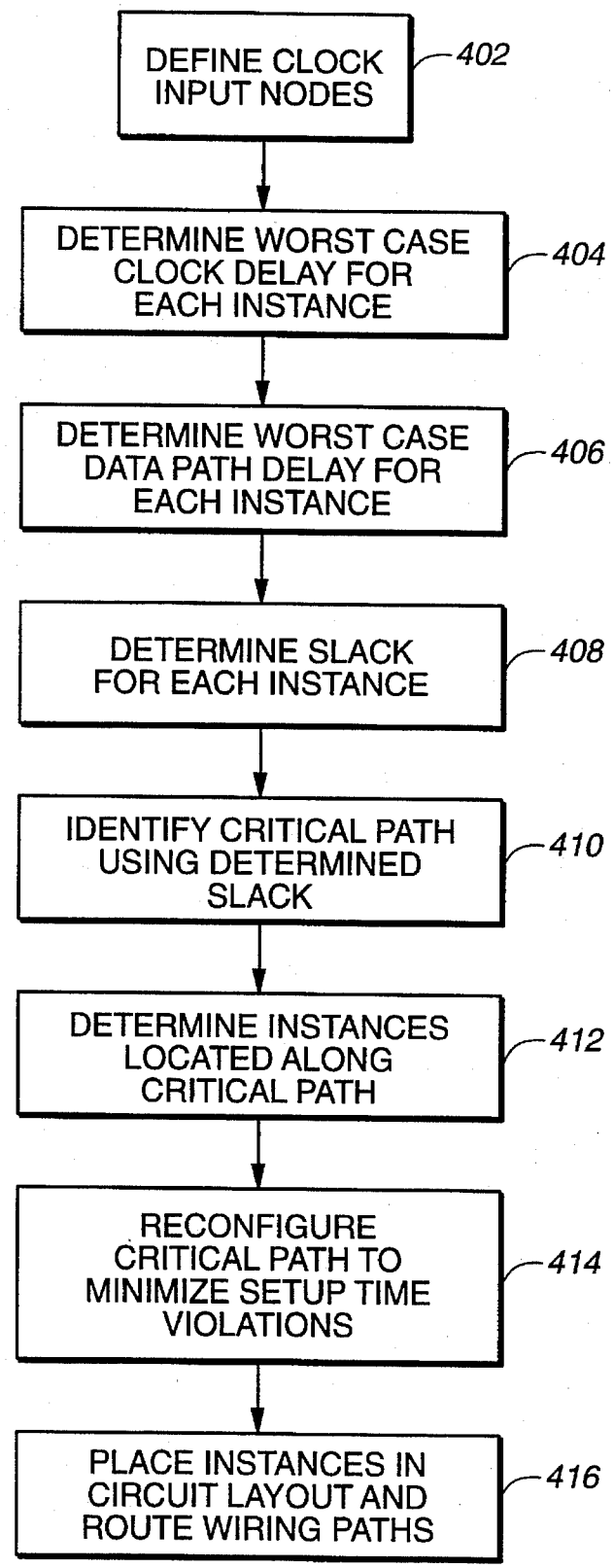
FIG._4

METHOD OF FINDING A CRITICAL PATH IN A CIRCUIT BY CONSIDERING THE CLOCK SKEW

BACKGROUND OF THE INVENTION

1. Field of the Invention:

The present invention relates generally to the design and fabrication of circuit layouts, and more particularly to methods which account for clock skew during the design and fabrication of circuit layouts.

2. State of the Art:

Conventional methods for designing and fabricating circuit layouts, such as integrated circuits, often include techniques for determining, prior to fabrication, those paths which possess the longest combination of physical signal transmission delays from an input node to an output node (i.e., longest combinational delay). The path of the circuit layout having the longest combinational delay from a first storage element to a second storage element is typically referred to as the critical path.

Because the delay time associated with each element of a circuit layout is known in advance, a combinational delay along each path (e.g., from a clocking in of data via each clock input of a first storage element to a data input of a subsequent storage element) can be measured. The combinational delay for each path is typically referred to as a weight of the path. Weights for each path are subsequently compared, with the greatest weight being deemed the critical path. A critical delay representing a worst case delay between storage elements of the circuit layout defines the maximum frequency (e.g., clock frequency) at which the circuit layout can operate.

It is important to determine the maximum frequency at which a circuit layout can operate in order to avoid what are referred to as "race" conditions. A race condition occurs when a node or circuit component in the circuit layout processes (e.g., stores) data prior to receipt of all necessary inputs. For example, assume that a circuit layout is operated at a clock frequency greater than the maximum frequency specified for the critical path. Further, assume that the circuit layout includes a storage element, such as a flip-flop at an output node of the critical path. Because the frequency of the circuit layout exceeds the maximum permissible frequency given the critical path, it is likely that a clock input to the flip-flop will occur prior to receipt of data at a data input of the flip-flop. Accordingly, the flip-flop will be clocked with invalid data. This can cause significant operational error of the circuit layout and is simply intolerable in the industry.

One typical method for designing and fabricating circuit layouts is described in a document entitled "Efficient Algorithms For Extracting The K Most Critical Paths In Timing Analysis", Design Automation Conference, 1989, pages 649–653, by S. Yen, D. Du and S. Ghanta. The method disclosed in this document represents conventional techniques of circuit design and fabrication which assume that clock distribution for the circuit layout is perfectly balanced. That is, clock signals are presumed to arrive at all storage element clock pins at the same time (i.e., no clock skew). The critical path is therefore considered to be directly proportional to the longest combinational delay through the circuit layout between two storage elements.

While conventional methods for locating critical paths have worked relatively well in the design and fabrication of circuit layouts to date, such methods often result in the fabrication of circuit layouts which include timing errors as the speed of circuit layouts continues to increase in the industry. Because conventional techniques determine a critical path based on the longest combinational delay between two storage elements through a physical layout of the circuit, race conditions which exist in the circuit layout due to clock skew go undetected. These race conditions can result in serious operational malfunctions. Accordingly, it would be desirable to provide a method for designing and fabricating circuit layouts which can account for clock skew in determining critical paths through a circuit layout.

SUMMARY OF THE INVENTION

Accordingly, the present invention is directed to a method of designing and fabricating a circuit layout which revolutionizes the manner by which critical weights of a circuit layout are assessed. In accordance with exemplary embodiments, a critical weight is not considered to be directly proportional to the physical path length between two storage elements. Rather, a critical path is assessed on the basis of both a physical delay associated with a path and any clock skew which exists with respect to instances (e.g., two storage element instances connected by the path). In accordance with exemplary embodiments, a critical path can be a path having the shortest physical length from an input node to an output node if the clock skew along this path results in a high probability of a race condition (i.e., the clock skew is large). In accordance with exemplary embodiments, clock skew can be assessed by determining the time differential between the arrival of the clock at each of two instances, such as two storage element instances, connected by the path. Generally speaking, the present invention relates to a method for producing a circuit layout having plural signal propagation paths, the method comprising the steps of attributing a weight to each of said paths, said weight including clock skew information, and comparing the weight of each of said paths to identify a critical path.

BRIEF DESCRIPTION OF THE DRAWINGS

The present invention will become more apparent from the following detailed description of preferred embodiments when read in conjunction with the drawings wherein like elements have been represented by like numerals and wherein:

FIG. 1 shows an exemplary circuit layout analyzed in accordance with exemplary embodiments of the present invention;

FIGS. 2a–2d illustrate an exemplary timing diagram;

FIG. 3 illustrates an exemplary timing diagram for components of the FIG. 1 circuit layout; and FIG. 4 illustrates a flow chart of an exemplary embodiment of the present invention.

DETAILED DESCRIPTION OF THE PREFERRED EMBODIMENTS

FIG. 1 illustrates an exemplary circuit layout which can be designed and fabricated in accordance with an exemplary embodiment of the present invention. The FIG. 1 circuit includes instances labelled with even numbers from 2 through 48. As referenced herein, an instance is any portion of a circuit layout which introduces a delay along any path in a circuit layout.

In the exemplary FIG. 1 layout, a data input node is labelled 50 and data output nodes are labelled 54 and 56. A clock input node is labelled 52, and is supplied to those instances which require clock inputs. For example, in the exemplary FIG. 1 embodiment, the instances 2, 16 and 48 can represent data storage element instances, such as flip-flops which receive both a data input and a clock input.

In accordance with exemplary embodiments, a method is provided for producing a circuit layout having plural signal propagation paths. For example, the FIG. 1 circuit layout includes plural signal propagation paths. A first signal propagation path for data input node 50 includes instances 2–14 between the clock input pin (labelled "cp") of data storage instance 2 and the data input pin (labelled "d") of the data storage instance 16. In an exemplary embodiment, a data path delay is assessed from the clock input pin of a first data storage instance since data present at the data input pin can not appear at the data output pin of that instance (labelled "Q") until a clock input is present. A second signal propagation path for the data input node 50 occurs from the clock input pin at data storage instance 2 through instances 2–14, 18–22 and 48 to the data input pin "d" of the data storage instance 48.

In accordance with an exemplary embodiment of the present invention, a weight is attributed to each of the signal propagation paths. In accordance with conventional systems, a balanced clock distribution tree is assumed in determining critical paths (i.e., clock skew has been ignored in determining the longest physical path through a circuit layout). However, because technologies have been scaled down to a point where clock skew can affect the occurrence of race conditions in circuit layouts, exemplary embodiments of the present invention attribute a weight to each signal propagation path by taking clock skew into account.

Referring to the exemplary FIG. 1 circuit layout, the clock signal present at the clock input node 52 is applied to the clock input pin "cp" for each of the data storage instances 2, 16 and 48. The clock signal propagates to each of the data storage instances via separate clock paths. For example, the clock signal present at clock input node 52 is applied to the data storage instance 2 via a clock signal path 58. Because no instances are present along the path 58, the clock signal is applied to the data storage instance 2 without delay. However, the clock signal is applied to a clock input pin of the data storage instance 16 via instances 24–38 located along a second clock signal path 60. The clock signal is applied to the clock input pin of the data storage instance 48 via a third clock signal path 62 which includes data storage instances 24–46.

Assuming that each of the instances 2–48 of the exemplary FIG. 1 circuit layout imparts an equal unit delay to a signal received by the instance, it is apparent that a clock signal present at the clock input node 52 will arrive at clock input pins (i.e., clock inputs) of the data storage instances 2, 16 and 48 at different times. To avoid a race condition at any of the data storage instances 2, 16 or 48, data must arrive at the data storage instance prior to the arrival of a clock signal. If the clock signal arrives prior to the data signal, invalid information present at the data input pin (i.e., data input) will be clocked into the data storage instance.

In accordance with conventional methods for designing and fabricating circuit layouts, effects of clock skew at the instances of a circuit layout were not taken into consideration. In the exemplary FIG. 1 embodiment, conventional design and fabrication techniques would have assessed the second signal propagation path between the data input node 50 and the data output node 56 as the critical path. That is, the longest physical combinational delay from a first data storage element to a second storage element would have been from a data source (i.e., source data storage instance 2) via instances 4–14 and 18–22 to destination data storage instance 48.

Assuming each of the instances in the FIG. 1 circuit layout includes a unit delay of one, the total delay between the data input node 50 and the data output node 56 would have been 10 unit delays. The delay between the data input node 50 and the data output node 54 would have been via instances 2–16 for a total delay of 7 unit delays. Thus, the data path between the data source instance 2 and the destination instance 48 would have been designated the critical path.

On the contrary, exemplary embodiments of the present invention use a radically different approach in assessing which data path of a circuit layout is most critical. That is, exemplary embodiments account for clock skew in assessing which path through a circuit layout is a critical path. In weighting each path of a circuit layout to determine a critical path in accordance with exemplary embodiments of the present invention, clock skew information is used to identify the path closest to causing a race condition. This path can then be weighted more heavily in identifying the critical path.

A critical path can be affected by clock skew in two ways: (1) a clock signal can arrive at a destination data storage instance (relative to the arrival of data at the destination data storage instance) earlier than the clock signal arrives at the source data storage instance (relative to the arrival of data) such that data arrives closer to the active clock edge of the destination data storage instance thereby rendering a shorter path through the circuit layout more critical; and (2) the clock signal can arrive at a destination data storage instance (relative to the arrival of data) later than the clock signal arrives at a source data storage instance (relative to the arrival of data) such that data arrives further from an active clock edge at the destination data storage instance whereby a longer path is actually less critical.

FIGS. 2(a)–(d) illustrate how a path through a circuit layout which does not necessarily include the longest physical combinational delay can actually be the path in which a clock signal and a data signal arrive closest together. In accordance with the present invention, this path is closer to causing a race condition and is weighted more heavily as a critical path. Such a path is weighted more heavily since it has a greater chance of resulting in a failed set-up time which can cause circuit operational error (i.e., a race condition).

Referring to FIG. 2(a), a waveform representing a data valid window constitutes the window of time in which a data signal from data input node 50 is available at the destination data storage instance 16. FIG. 2(b) illustrates a clock signal from the clock input node 52 which is directly input via the clock signal path 60 to a clock input of the data storage instance 16.

The data signal of FIG. 2(a) is present at the data input of the data storage instance 16 well in advance of the presence of the FIG. 2(b) clock signal at the clock input. Thus, the probability of a race condition at the data storage instance 16 is relatively small. Rather, an amount of safety labeled "a" in FIG. 2(b) exists since data is present before the clock signal, and therefore easily clocked into the data storage instance 16 via the active rising clock edge of the clock signal. If additional delays existed in this clock signal path, the amount of safety would increase since the active edge of the clock signal would move further from the edge of the data valid window. Referring to FIG. 2(c), an additional delay of the active edge of the clock signal increases the margin of safety between the presence of data at a data input of the data storage instance 16 and the clock input of the data storage instance 16.

On the contrary, if less delay existed in the clock signal path to data storage instance 16, the margin of safety is reduced since the active edge of the clock signal now moves closer toward the edge of the data valid window as represented by the clock signal in FIG. 2(d). This relationship between the active edge of a clock signal and a data valid window constitutes the clock skew of the instance, and is taken into consideration in weighting the signal propagation paths of a circuit layout.

Referring again to FIG. 1, each instance is considered to possess a 1 unit delay. Those skilled in the art will appreciate that the use of a constant 1 unit delay for all instances is by way of example only, and that in actuality, a circuit layout can be composed of many different types of instances possessing many different types of delays. The use of a single unit delay for all instances is merely intended to simplify explanation of features in accordance with exemplary embodiments.

As described previously, a conventional circuit fabrication technique would identify the path from the source data storage instance 2 through instances 4–14 and 18–22 to destination data storage instance 48 as the critical path. Consequently, a circuit designer would attempt to fabricate this path with a minimum delay to optimize the maximum permissible operating frequency. For example, the circuit designer might attempt to reduce physical distances between instances along this path (i.e., reduce the overall data path length) to minimize the critical delay of the circuit layout. Such techniques fail to recognize the significance clock skew can have on circuit operation.

Accordingly, exemplary embodiments of the present invention account for clock skew in weighting signal propagation paths to optimize circuit layout fabrication and minimize the possibility of race conditions. In the following discussion, the term "slack" refers to any extra time which exists between the arrival of data at a data storage instance prior to arrival of a clock signal at that data storage instance. Slack can be considered the arrival time of a clock signal minus the arrival time of a data signal and minus any set-up time required by the instance (i.e., a minimum time each of the clock and data signals must be present to accurately store data). That is:

slack = (arrival time of active clock edge) −

(arrival time of data signal) − (set-up time)

For purposes of the following discussion, and to simply understanding of the present invention, data storage instances will be considered to have a set-up time of zero. In this case, slack is equal to the difference between the arrival time of the active clock edge and the arrival time of a data input to a given data storage instance.

Referring to the FIG. 1 circuit layout in conjunction with the waveforms of FIGS. 3(a)–3(e), a data signal will arrive at the data input of destination data storage instance 48 via the second signal propagation path with a 10 unit delay. The active edge of the clock signal from the clock input node 52 arrives at the clock input of the destination storage instance 48 with a 12 unit delay (i.e., via instances 24–46). Thus, the slack associated with the arrival of data at the destination storage instance 48 is (12–10), or 2 time units of slack.

Turning now to the first signal propagation path, data arrives at the data input of the destination data storage instance 16 with a 7 unit delay (i.e., a delay via instances 2–14). The active edge of the clock signal arrives at the clock input of the destination data storage instance 16 with an 8 unit delay (i.e., via instances 24–38). Thus, the slack on the arrival of data at the destination data storage instance 16 is (8–7), or 1 time unit of slack.

Thus, exemplary embodiments of the present invention weight the first signal propagation path between the source data storage instance 2 and the destination data storage instance 16 more heavily since the first signal propagation path is closest to violating the set-up time of the destination data storage instance 16 (i.e., closer to causing a race condition which can result in operational error). As a result, fabrication of a circuit layout in accordance with the present invention is directed to improving the potential race condition at the destination data storage instance 16 to minimize the possibility of the data signal arriving prior to the active edge of the clock input. Such a redesign and fabrication can be achieved by, for example, minimizing the physical separation distance of instances 2–14 in an effort to cause the data signal to arrive at the destination data storage instance 16 earlier, or, if necessary, increasing the delay between the instances 24–38 along the clock signal path from clock input node 52 to the data storage instance 16.

The slack present at each of the destination data storage instances 16 and 48 is illustrated in FIGS. 3(a)–3(e). Unit delays for instances illustrated in the FIG. 1 circuit layout are located below FIG. 3(e). The active edge of the clock signal present at the clock input node 52 is illustrated in FIG. 3(a) as occurring with a zero unit delay. The active edge of the clock signal arrives at the clock input of the data storage instance 48 with a 12 unit delay, as illustrated in FIG. 3(b). The data signal from input node 50 is illustrated as occurring at the data input of the destination data storage instance 48 in FIG. 3(c) with a 10 unit delay, such that the slack at the data storage instance 48 is two time units.

As illustrated in FIG. 3(d), the clock signal at the clock input of destination data storage instance 16 arrives with an 8 unit delay. As illustrated in FIG. 3(e), the data from input node 50 arrives at the data input of the destination data storage instance 16 with a 7 unit delay, thereby producing a slack of 1 time unit.

Thus, FIGS. 3(a)–3(e) illustrate that although the destination data storage instance 48 processes data at a point later in time than does the destination data storage instance 16, and is located in a data path having the longest physical combinational delay, the data storage instance 16 actually possesses the least amount of slack in processing data. In accordance with the present invention, the data path to data storage instance 16 is therefore weighted more heavily in assessing the critical path through the FIG. 1 circuit layout.

FIG. 4 is a flowchart of a circuit design and fabrication method in accordance with an exemplary embodiment of the present invention. In FIG. 4, a weight is attributed to each of the signal propagation paths through a circuit layout, with the weight attributed to each path including clock skew information. The step of attributing includes a step of defining at least one node of the circuit layout as a clock source as implemented by block 402 of FIG. 4. In the exemplary FIG. 1 embodiment, the clock input node 52 can be defined by the user as a primary input pin which serves as a clock input. Alternately, the clock input pin of data storage instance 2 can be defined as a clock input.

For each defined clock source (e.g., clock input node or clock input pin), the source clock inputs of all instances which can be reached from that defined clock source are identified using, for example, a breadth first search of the circuit layout to locate each clock signal path from the clock input node to specified instances (e.g., storage instances). For each clock input, the clock delay along a clock signal path is determined from the clock input to each specified instance connected to the clock input. Using a breadth first search, the total delay of a clock signal path can be determined at the same time the clock signal path is traced (i.e., located).

An arrival time of the active edge of a clock signal at a specified instance from each defined clock input can be considered the clock delay of the instance. Thus, the arrival time can be represented as the delay which occurs between the presence of an active clock edge at a clock input (e.g., the defined clock input node 52) and the presence of the active clock edge at an instance under consideration. The arrival time of the active clock edge and the defined clock source node are then stored in memory for each instance. Where plural clock signal paths exist between a given clock node and a given instance, the clock signal path having the longest delay for that instance can be determined. That is, each different clock path of the instance is assessed, with the longest clock path being selected in block 404 as the worst case clock signal delay for the instance.

In determining the worst case clock signal path delay for a given instance, a netlist of the circuit layout can be accessed to identify those instances along a first path between the defined clock input and the instance under consideration. A predetermined delay for each instance identified along the first path can be obtained from memory. The predetermined delays of all instances identified along the first clock signal path are added to determine a clock signal delay for the first clock signal.

Where plural clock signal paths exist between a given clock input and a given instance, the steps of accessing, obtaining and adding can be repeated for each successive path between the clock input node and the instance to determine the worst case clock signal delay time between the clock input and the instance under consideration. Where plural clock inputs exist for a circuit layout, the steps of accessing, obtaining, adding and repeating can be performed for the instance with respect to each clock input connected to that instance. The worst case clock signal delay time for an instance under consideration can be determined by comparing the delays of the clock signal paths connected to that instance. After considering all clock signal paths connected to a given instance, both the identity of the clock input and the delay of clock signal path associated with the worst case delay are stored with respect to the instance.

For the exemplary embodiment illustrated in FIG. 1 and described with respect to FIGS. 3(a)–3(e), the data storage instances 2, 16 and 48 each include clock input pins connected with the clock input node 52 via different clock signal paths having different delays. The delays for each of the first, second and third clock signal paths can be easily derived by performing a breadth first search through the circuit layout beginning with the clock input node 52.

In the FIG. 1 example, only a single clock input node exists. Further, there is only one clock signal path with respect to each data storage instance. Consequently, step 404 of the FIG. 4 flowchart results in storing an identity of the defined clock source (e.g., clock input node 52 or the clock input pin of data storage instance 2) with respect to each of the data storage instances 2, 16 and 48. Further, clock signal path delays of 0, 8 and 12 time units are stored in step 404 for data storage instances 2, 16 and 48, respectively.

Having determined the worst case delay for an active edge of a clock signal to each instance to be considered in step 404, a worst case delay between a data source (e.g., primary data input pin such as the data input node 50, the clock input of a source data storage instance 2, or the data output of source data storage instance 2) to a data input of a destination data storage instance is determined. For each data input pin of a circuit layout, all data storage instances having data input pins which can be reached from the data source are determined using, for example, a breadth first search technique. For each data storage instance, the breadth first search technique can be used to access a netlist of the circuit layout and to identify instances along each data path between a data source and a first data input pin of the storage instance under consideration.

For each data input of a data storage instance under consideration, the worst case arrival time of a data signal (i.e., longest path) can be determined in step 404 using the breadth first search technique in a manner similar to that used to define the worst case clock delay for each instance. This can be achieved by obtaining a predetermined delay, from memory, for each instance identified along a signal propagation path between a data source and a data input of a storage instance under consideration, and then adding the predetermined delays of all instances along the first path.

Where plural signal propagation paths exist between a given data source and an instance under consideration, the steps of accessing, obtaining and adding can be repeated for each successive path between the data source and the instance under consideration. Where plural data sources provide data to an instance under consideration, the steps of accessing, obtaining, adding and repeating can be performed for each data path between the various data sources and the instance under consideration.

The arrival time of the data input signal representing the worst case delay and the identity of the data source which supplied this data input signal along the path having the worst case delay are then stored with respect to the instance under consideration. A worst case delay is stored, along with the data source associated with this delay, for each instance designated as a destination data storage instance, as illustrated in step 406.

For the exemplary circuit layout of FIG. 1 as described with respect to FIGS. 3(a)–3(e), the data input pin of the source data storage instance 2 is reached from the data input node 50 with a zero unit delay. The data output of storage instance 2 can be designated a data source since data is clocked through the instance 2 upon receipt of a clock signal. The clock input of the data storage instance 2 receives an active edge of the clock signal from the clock input node 52 with a zero unit delay. The data input pin "d" of the destination data storage instance 16 receives a data signal with a 7 unit delay relative to the clocking of data through data storage instance 2. The data input pin "d" of the destination data storage instance 48 receives a data signal with a 10 unit delay.

Having determined the delay of the worst case clock signal path and the delay of the worst case data signal path for each instance in steps 404 and 406, a worst case slack is determined for each instance under consideration in step 408. The worst case slack condition for each instance is used to weight the data/clock signal paths to each instance such that a critical path can be identified in step 410. A weight for each instance can be determined for each possible data source (e.g., clock pin or primary input pin) of the instance. If the data source is a clock input pin of a source data storage instance, the arrival time of the active edge of the clock signal at the source data storage instance (which has been previously stored) is also required. However, if the data source is a primary data input pin of the circuit layout (e.g., data input node 50), then the data source clock arrival time is set to zero. The critical weight and the identity of the data source are stored in step 410.

The critical weight of step 410 can, for example, be determined as follows:

Critical weight = (data path delay) +

(data source clock arrival) − (clock arrival time) −

(set-up time of storage element)

The step of determining a critical weight for an instance under consideration is then repeated for each of the data storage instances in the circuit layout. The data storage instance having the smallest critical weight is determined using a linear search of each storage instance to locate the critical weight and source node pair having the smallest critical weight. The source associated with the smallest critical weight is considered the source of the critical path.

Referring to the exemplary FIG. 1 circuit layout, the slack associated with the data storage instance 16 results in a critical weight of 1 unit delay, while the slack associated with the destination data storage instance 48 results in a determination of a critical weight of a two unit delay.

Thus, the smallest critical weight is a 1 unit delay. The critical path ends at the "d" data input pin of the data storage instance 16. The data source for the destination data storage instance 16 is the input of the source data storage instance 2. That is, as derived from the critical weight and data source pairs of information previously stored, the critical path starts at the clock input pin of the source data storage instance 2 and ends at the input data pin d of the destination data storage instance 16.

The critical path between the source and destination data storage instances can be determined using a depth first search longest path technique with partial path pruning as described for example in the Ghanta et al document previously described, the disclosure of which is hereby incorporated by reference. The list of instances in the critical path can be determined in step 412. These instances can be stored and printed for use by the circuit designer to reconfigure the circuit layout for fabrication. Referring to the exemplary FIG. 1 circuit layout, the longest path between source and destination data storage instances passes through instances 2–14 to the data input of the destination data storage instance 16.

After determining the critical path of the circuit layout using techniques of the present invention, the next most critical path can be determined, if desired, by moving to the second smallest critical weight. Using the next most critical path, the steps of determining the data storage instance with the smallest critical weight using a linear search of each data storage instance and then finding the longest path between the source and destination nodes can be repeated. This process can be repeated any number of times (e.g., with respect to the N most critical paths, where N is any whole number).

The circuit layout can be reconfigured in step 414 for fabrication using the critical path information obtained so that race conditions can be minimized and circuit operability improved. For example, the FIG. 1 circuit layout can be fabricated to reduce the delay between the source data storage instance 2 and the data input of the destination data storage instance 16, or by increasing the delay in the clock signal path from the clock input node 52 to the clock input of the destination data storage instance 16.

Fabrication of the circuit layout can be performed in step 416 using any conventional manner. For example, instances, at a transistor level, can be located (e.g., using a place and route technique) onto the substrate of an integrated circuit.

Those skilled in the art will recognize that the exemplary embodiments described with respect to FIG. 1 are by way of illustration only. The present invention can be applied to any circuit layout of any size, including instances of any type having any of numerous delays.

It will be appreciated by those skilled in the art that the present invention can be embodied in other specific forms without departing from the spirit or essential characteristics thereof. The presently disclosed embodiments are therefore considered in all respects to be illustrative and not restricted. The scope of the invention is indicated by the appended claims rather than the foregoing description and all changes that come within the meaning and range and equivalence thereof are intended to be embraced therein.

What is claimed is:

1. Method for producing a circuit layout having plural signal propagation paths, the method comprising the steps:

attributing a weight to each of said paths, said weight including clock skew information; and comparing the weight of each of said paths to identify a critical path, said step of attributing a weight further including steps of:

weighting at least one instance using a clock signal path delay and a data path delay; and subtracting the clock signal path delay of said at least one instance from said data path delay of said at least one instance to determine said weight of said at least one instance.

2. Method according to claim 1, wherein said step of attributing a weight includes the further steps of:

defining at least one node of the circuit layout as a clock source.

3. Method according to claim 2, further comprising the steps of:

determining a clock delay from each clock source to at least one instance located along each of said plural signal propagation paths.

4. Method according to claim 3, wherein said step of determining further includes the steps of:

accessing a netlist of the circuit layout to identify instances along a first clock signal path between the clock source and said at least one instance;

obtaining from memory a predetermined delay for each instance identified along the first clock signal path; and adding the predetermined delays of all instances identified along the first clock signal path.

5. Method according to claim 4, wherein said step of determining further includes the steps of:

repeating the steps of accessing, obtaining and adding for each additional clock signal path between said clock source and said at least one instance; and storing, for said at least one instance, an identity of a clock source and a delay determined for a clock signal path between the clock input and the at least one instance.

6. Method according to claim 4, further including the steps of:

determining said data path delay from a data source to a data input of at least one instance of the circuit layout.

7. Method according to claim 6, wherein said step of determining said data path delay further includes the steps of:

accessing said netlist of the circuit layout to identify instances along a first data path between a data source and said at least one instance;

obtaining from memory a predetermined delay for each instance identified along the first data path;

adding the predetermined delays of all instances identified along the first data path;

repeating the steps of accessing, obtaining and adding for each additional data path to said at least one instance; and storing, for said at least one instance, an identity of a data source and a delay determined for a data path between the data source and the at least one instance.

8. Method according to claim 7, wherein said step of weighting further includes the steps of:

subtracting the clock signal path delay of said at least one instance from said data path delay of said at least one instance to determine said weight.

9. Method according to claim 7, further comprising the steps of:

weighting a data path for each of plural output nodes of the circuit layout;

comparing the weights determined for each of the plural output nodes; and identifying a data path which has the smallest weight as a critical path of the circuit layout.

10. Method according to claim 9, further comprising the step of:

placing circuit components in the circuit layout to modify the weight of the critical path.

11. Method according to claim 1, further including the steps of:

determining a data path delay from a data source to a data input of at least one instance of the circuit layout.

12. Method according to claim 11, wherein said step of determining further includes the steps of:

accessing a netlist of the circuit layout to identify instances along a first data path between said data source and said at least one instance;

obtaining from memory a predetermined delay for each instance identified along the first data path; and adding the predetermined delays of all instances identified along the first data path.

13. Method according to claim 12, wherein said step of determining further includes the steps of:

repeating the steps of accessing, obtaining and adding for each additional data path to said at least one instance; and storing, for said at least one instance, an identity of a data source and a delay determined for a data path between the data source and the at least one instance.

14. Method according to claim 13, further including the steps of:

weighting said at least one instance using a clock signal path delay and said data path delay.

15. Method according to claim 14, wherein said step of weighting further includes the steps of:

subtracting the clock signal path delay of said at least one instance from said data path delay of said at least one instance to determine said weight.

16. Method for producing a circuit layout comprising the steps of:

determining a clock delay along a clock signal path from at least one clock source of the circuit layout to at least one instance of the circuit layout;

determining a data path delay along a data path from at least one data source of the circuit layout to said at least one instance; and weighting said data path of said at least one instance using said clock delay and said data path delay, said step of weighting further including the step of:

subtracting the clock signal path delay of said at least one instance from said data path delay of said at least one instance to determine said data path weight.

17. Method according to claim 16, further comprising the steps of:

weighting a data path for each of plural output nodes of the circuit layout;

comparing the weights determined for each of the plural output nodes; and identifying a data path which has the smallest weight as a critical path of the circuit layout.

18. Method according to claim 17, further comprising the step of:

placing circuit components in the circuit layout to modify the weight of the critical path.

* * * * *